(12) United States Patent
Sasaki

(10) Patent No.: US 9,716,004 B2
(45) Date of Patent: Jul. 25, 2017

(54) CRYSTAL LAMINATE STRUCTURE AND METHOD FOR PRODUCING SAME

(75) Inventor: Kohei Sasaki, Tokyo (JP)

(73) Assignee: TAMURA CORPORATION, Tokyo (JP)

( * ) Notice: Subject to any disclaimer, the term of this patent is extended or adjusted under 35 U.S.C. 154(b) by 0 days.

(21) Appl. No.: 14/343,355

(22) PCT Filed: Aug. 2, 2012

(86) PCT No.: PCT/JP2012/069709
§ 371 (c)(1),
(2), (4) Date: Mar. 6, 2014

(87) PCT Pub. No.: WO2013/035464
PCT Pub. Date: Mar. 14, 2013

(65) Prior Publication Data
US 2014/0217554 A1    Aug. 7, 2014

(30) Foreign Application Priority Data

Sep. 8, 2011   (JP) .................. 2011-196430

(51) Int. Cl.
*H01L 29/04*   (2006.01)
*H01L 29/24*   (2006.01)
(Continued)

(52) U.S. Cl.
CPC ...... *H01L 21/02609* (2013.01); *C30B 23/025* (2013.01); *C30B 25/186* (2013.01);
(Continued)

(58) Field of Classification Search
CPC .... H01L 21/02565; C30B 25/20; C30B 29/16
See application file for complete search history.

(56) References Cited

U.S. PATENT DOCUMENTS

| 2004/0007708 A1 | 1/2004 | Ichinose et al. |
| 2006/0001031 A1 | 1/2006 | Ichinose et al. |

(Continued)

FOREIGN PATENT DOCUMENTS

| CN | 1474466 A | 2/2004 |
| CN | 100370065 C | 2/2008 |

(Continued)

OTHER PUBLICATIONS

Villora et al. Rf-plasma-assisted molecular beam epitaxy of beta-Ga 2 O 3. Applied Physics Letters 88, 031105 (2006).*
(Continued)

*Primary Examiner* — Raj R Gupta
(74) *Attorney, Agent, or Firm* — McGinn IP Law Group, PLLC.

(57) ABSTRACT

A crystal laminate structure, in which crystals can be epitaxially grown on a β-$Ga_2O_3$-based substrate with high efficiency to produce a high-quality β-$Ga_2O_3$-based crystal film on the substrate; and a method for producing the crystal laminate structure are provided. The crystal laminate structure includes: a β-$Ga_2O_3$-based substrate, of which the major face is a face that is rotated by 50 to 90° inclusive with respect to face; and a β-$Ga_2O_3$-based crystal film which is formed by the epitaxial crystal growth on the major face of the β-$Ga_2O_3$-based substrate.

12 Claims, 7 Drawing Sheets

(51) Int. Cl.

| | |
|---|---|
| *H01L 29/267* | (2006.01) |
| *H01L 29/47* | (2006.01) |
| *H01L 21/02* | (2006.01) |
| *C30B 29/16* | (2006.01) |
| *C30B 29/22* | (2006.01) |
| *C30B 25/18* | (2006.01) |
| *C30B 25/20* | (2006.01) |
| *H01L 29/66* | (2006.01) |
| *H01L 29/778* | (2006.01) |
| *H01L 29/812* | (2006.01) |
| *H01L 29/872* | (2006.01) |
| *C30B 23/02* | (2006.01) |

(52) U.S. Cl.
CPC .............. *C30B 25/20* (2013.01); *C30B 29/16* (2013.01); *C30B 29/22* (2013.01); *H01L 21/02414* (2013.01); *H01L 21/02433* (2013.01); *H01L 21/02565* (2013.01); *H01L 21/02579* (2013.01); *H01L 21/02631* (2013.01); *H01L 21/02636* (2013.01); *H01L 21/02661* (2013.01); *H01L 29/045* (2013.01); *H01L 29/24* (2013.01); *H01L 29/66969* (2013.01); *H01L 29/7787* (2013.01); *H01L 29/812* (2013.01); *H01L 29/872* (2013.01)

(56) References Cited

U.S. PATENT DOCUMENTS

| | | | |
|---|---|---|---|
| 2006/0150891 A1* | 7/2006 | Ichinose | C30B 23/02 117/2 |
| 2007/0134833 A1* | 6/2007 | Ikemoto | H01L 21/02414 438/33 |
| 2007/0166967 A1 | 7/2007 | Ichinose et al. | |
| 2008/0070337 A1 | 3/2008 | Ichinose et al. | |
| 2008/0237607 A1 | 10/2008 | Ichinose et al. | |
| 2008/0265264 A1 | 10/2008 | Ichinose et al. | |
| 2010/0038652 A1 | 2/2010 | Ichinose et al. | |
| 2010/0229789 A1 | 9/2010 | Ichinose et al. | |
| 2010/0258898 A1* | 10/2010 | Lahreche | H01L 29/432 257/472 |
| 2012/0304918 A1 | 12/2012 | Ichinose et al. | |
| 2013/0248902 A1 | 9/2013 | Ichinose et al. | |
| 2014/0048823 A1 | 2/2014 | Sato et al. | |
| 2014/0306237 A1 | 10/2014 | Ichinose et al. | |

FOREIGN PATENT DOCUMENTS

| | | |
|---|---|---|
| CN | 103503148 A | 1/2014 |
| JP | 2004-269338 A | 9/2004 |
| JP | 2005-235961 A | 9/2005 |
| JP | 2005-340308 A | 12/2005 |
| JP | 2008-156141 A | 7/2008 |
| JP | 2008-303119 A | 12/2008 |
| JP | 2009-200222 A | 9/2009 |
| JP | 2010-010572 A | 1/2010 |
| JP | 2011-146652 A | 7/2011 |

OTHER PUBLICATIONS

International Search Report dated Sep. 11, 2012 in PCT/JP2012/069709 (English version).

Chinese Office Action (and Search Report) dated Nov. 25, 2015 with English translation.

Chinese Office Action dated Aug. 16, 2016 and English translation thereof.

\* cited by examiner

CRYSTAL LAMINATE STRUCTURE AND METHOD FOR PRODUCING SAME

TECHNICAL FIELD

The invention relates to a crystal laminate structure (or laminated crystal structure) and a method for producing the crystal laminate structure and, in particular, to a crystal laminate structure including a β-$Ga_2O_3$-based substrate with a β-$Ga_2O_3$-based crystal film and a method for producing the crystal laminate structure.

BACKGROUND ART

A conventional semiconductor element in which a Ga-containing oxide is deposited on an element substrate formed of a β-$Ga_2O_3$ single crystal is known (see, e.g., PTL 1).

This type of semiconductor element is formed by laminating a layer(s) of n-type or p-type conductivity on a main surface of a β-$Ga_2O_3$ single crystal substrate using a physical vapor-phase growth method such as MBE (Molecular Beam Epitaxy) or a chemical vapor-phase growth method such as CVD.

In addition, a (100) plane having high cleavability and thus providing a flat surface easily is often used as the main surface of the β-$Ga_2O_3$ single crystal substrate (see, e.g., PTL 2).

CITATION LIST

Patent Literature

[PTL 1]
JP-A-2005-235961
[PTL 2]
JP-A-2008-156141

SUMMARY OF INVENTION

Technical Problem

In general, growth temperature needs to be high to some extent in order that high-quality crystals without mixture of heterogeneous phase are formed by epitaxial growth. However, when a crystal is epitaxially grown on a β-$Ga_2O_3$ single crystal substrate having a (100) plane as a main surface, a growth rate tends to decrease with increasing growth temperature of the crystal. It is believed that this is because raw materials of the crystal re-evaporate from the substrate and this causes a problem that the raw materials are wasted.

It is an object of the invention to provide a crystal laminate structure that crystals can be epitaxially grown on a β-$Ga_2O_3$-based substrate with high efficiency to produce a high-quality β-$Ga_2O_3$-based crystal film, and a method for producing the crystal laminate structure.

Solution to Problem

According to one embodiment of the invention, a crystal laminate structure as defined in [1] to [3] below and a method for producing a crystal laminate structure as defined in [4] to [6] below are provided so as to achieve the above object.

[1] A crystal laminate structure, comprising:
 a β-$Ga_2O_3$-based substrate comprising as a main surface a plane rotated by not less than 50° and not more than 90° with respect to a (100) plane; and
 a β-$Ga_2O_3$-based crystal film that is formed by epitaxially growing a crystal on the main surface of the β-$Ga_2O_3$-based substrate.

[2] The crystal laminate structure according to [1], wherein the main surface comprises one of a (010) plane, a (001) plane, a (−201) plane, a (101) plane and a (310) plane.

[3] The crystal laminate structure according to [1] or [2], wherein the β-$Ga_2O_3$-based crystal film comprises a $(Al_{1-x}Ga_x)_2O_3$ crystal (0<x≤1).

[4] A method for producing a crystal laminate structure, comprising:
 a step of forming a β-$Ga_2O_3$-based crystal film by epitaxial growth of a β-$Ga_2O_3$-based crystal on a main surface of a β-$Ga_2O_3$-based substrate,
 wherein the main surface comprises a plane rotated by not less than 50° and not more than 90° with respect a (100) plane.

[5] The method for producing a crystal laminate structure according to [4], wherein the main surface comprises one of a (010) plane, a (001) plane, a (−201) plane, a (101) plane and a (310) plane.

[6] The method for producing a crystal laminate structure according to [4] or [5], wherein a growth temperature for the epitaxial growth is not less than 700° C.

Advantageous Effects of Invention

According to an embodiment of the invention, a crystal laminate structure can be provided that crystals can be epitaxially grown on a β-$Ga_2O_3$-based substrate with high efficiency to produce a high-quality β-$Ga_2O_3$-based crystal film, as well as a method for producing the crystal laminate structure.

DESCRIPTION OF EMBODIMENTS

[First Embodiment]

According to the present embodiment, β-$Ga_2O_3$-based crystals can be epitaxially grown on a β-$Ga_2O_3$-based substrate with high efficiency to form a high-quality β-$Ga_2O_3$-based crystal film without mixture of heterogeneous phase. In conventional methods in which a β-$Ga_2O_3$-based crystal is epitaxially grown on a β-$Ga_2O_3$-based substrate having a (100) plane as a main surface, a sufficient growth rate is not obtained at a growth temperature required to grow high-quality crystals, e.g., at a growth temperature of not less than 700° C., and it is not possible to efficiently grow crystals. However, the present inventors found that, when a β-$Ga_2O_3$-based substrate of which main face is a plane rotated by not less than 50° and not more than 90° with respect a (100) plane is used as a base for epitaxial crystal growth, high-quality β-$Ga_2O_3$-based crystals are grown at a sufficient rate. Examples of embodiments thereof will be described in detail below.

(Configuration of Crystal Laminate Structure)

Figure 1:
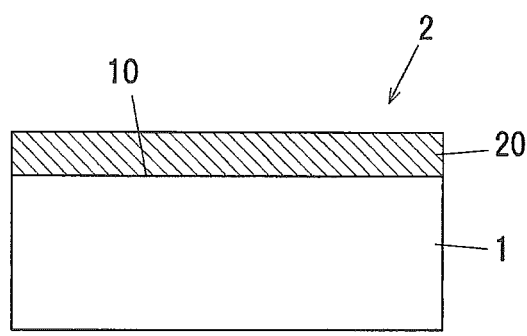
FIG. 1 is a cross sectional view showing a crystal laminate structure in a first embodiment.

FIG. 1 is a cross sectional view showing a crystal laminate structure in the first embodiment. A crystal laminate structure 2 includes a β-$Ga_2O_3$-based substrate 1 and a β-$Ga_2O_3$-based crystal film 20 formed on a main surface 10 of the β-$Ga_2O_3$-based substrate 1.

The main surface 10 of the β-$Ga_2O_3$-based substrate 1 is a plane which is rotated by not less than 50° and not more than 90° with respect the (100) plane. In other words, in the β-$Ga_2O_3$-based substrate 1, an angle θ (0<θ≤90°) formed between the main surface 10 and the (100) plane is not less than 50°. Examples of the plane rotated by not less than 50° and not more than 90° with respect the (100) plane include a (010) plane, a (001) plane, a (−201) plane, a (101) plane and a (310) plane.

When the main surface 10 of the β-$Ga_2O_3$-based substrate 1 is a plane rotated by not less than 50° and not more than 90° with respect the (100) plane, it is possible to effectively suppress re-evaporation of raw materials of the β-$Ga_2O_3$-based crystal from the β-$Ga_2O_3$-based substrate 1 at the time of epitaxially growing the β-$Ga_2O_3$-based crystal on the β-$Ga_2O_3$-based substrate 1. In detail, where a percentage of the re-evaporated raw material during growth of the β-$Ga_2O_3$-based crystal at a growth temperature of 500° C. is defined as 0%, the percentage of the re-evaporated raw material can be suppressed to be not more than 40% when the main surface 10 of the β-$Ga_2O_3$-based substrate 1 is a plane rotated by not less than 50° and not more than 90° with respect the (100) plane. It is thus possible to use not less than 60% of the supplied raw material to form the β-$Ga_2O_3$-based crystal, which is preferable from the viewpoint of growth rate and manufacturing cost of the β-$Ga_2O_3$-based crystal.

The β-$Ga_2O_3$-based substrate 1 is formed of, e.g., a β-$Ga_2O_3$ single crystal. The β-$Ga_2O_3$ crystal has a monoclinic crystal structure and typically has lattice constants of a=12.23 Å, b=3.04 Å, c=5.80 Å, α=γ=90° and β=103.7°.

In the β-$Ga_2O_3$ crystal, the (100) plane comes to coincide with the (310) plane when rotated by 52.5° around the c-axis and comes to coincide with the (010) plane when rotated by 90°. Meanwhile, the (100) plane comes to coincide with the (101) plane when rotated by 53.8° around the b-axis, comes to coincide with the (001) plane when rotated by 76.3° and comes to coincide with the (−201) plane when rotated by 53.8°.

It should be noted that, the β-$Ga_2O_3$-based substrate 1 is basically formed of a β-$Ga_2O_3$ single crystal as described above but may be foamed of an oxide including mainly Ga doped with one or more elements selected from the group consisting of Cu, Ag, Zn, Cd, Al, In, Si, Ge and Sn. It is possible to control a lattice constant, bandgap energy or electrical conduction properties by adding such elements. It is possible to use the β-$Ga_2O_3$-based substrate 1 formed of, e.g., a $(Ga_xAl_yIn_{(1-x-y)})_2O_3$ (where 0<x≤1, 0≤y≤1, 0<x+y≤) crystal which is a β-$Ga_2O_3$ crystal doped with Al and In. The band gap is widened by adding Al and is narrowed by adding In.

When the elements listed above are added to the β-$Ga_2O_3$ crystal, lattice constants may slightly change. Even in such a case, the (010) plane, the (001) plane, the (−201) plane, the (101) plane and the (310) plane still fall under the category of a plane rotated by not less than 50° and not more than 90° with respect the (100) plane.

The β-$Ga_2O_3$-based crystal film 20 is formed of a β-$(Al_{1-x}Ga_x)_2O_3$ crystal (0<x≤1), e.g., a β-$Ga_2O_3$ crystal (when x=1). In addition, the β-$Ga_2O_3$-based crystal film 20 may contain conductive impurities.

(Method for Producing Crystal Laminate Structure)

Firstly, an ingot for forming the β-$Ga_2O_3$-based substrate 1 is produced by, e.g., the FZ (Floating Zone) method or the EFG (Edge Defined Film Fed Growth) method, etc.

In case of using the FZ method, an ingot is formed using, e.g., an infrared-heating single crystal manufacturing system. In detail, firstly, an end of a seed crystal is held on a seed chuck and an upper end portion of a rod-like polycrystalline raw material is held on a raw-material chuck. After adjusting a vertical position of an upper rotating shaft, the top edge of the seed crystal is brought into contact with the lower edge of the polycrystalline raw material. The vertical position of the upper rotating shaft and that of a lower rotating shaft are adjusted so that light of halogen lamp is focused on the upper edge of the seed crystal and the lower edge of the polycrystalline raw material. After the adjustment, the upper edge of the seed crystal and the lower edge of the polycrystalline raw material are heated so that the heated portion is melted, thereby forming melt droplets. At this time, only the seed crystal is being rotated. The aforementioned portion is melted while rotating the polycrystalline raw material and the seed crystal in opposite directions so as to be mixed sufficiently and the polycrystalline raw material and the seed crystal are then pulled in directions opposite to each other to form a single crystal having appropriate length and thickness, thereby making an ingot.

In case of using the EFG method, a predetermined amount of β-$Ga_2O_3$ powders, etc., to be a raw material is put in a crucible and is melted by heating, thereby producing β-$Ga_2O_3$ melt. Through a slit formed on a slit die which is placed in the crucible, the β-$Ga_2O_3$ melt is drawn up to an upper surface of the slit die by capillary action, the β-$Ga_2O_3$ melt is cooled by contact with the seed crystal and an ingot having an arbitrary cross sectional shape is thereby formed.

It should be noted that, a desired conductive impurity may be added when producing β-$Ga_2O_3$ ingots by such producing methods.

The β-$Ga_2O_3$ ingot formed as described above is sliced by, e.g., a wire saw so that a cross section thereof is a plane rotated by not less than 50° and not more than 90° with respect the (100) plane, thereby obtaining the β-$Ga_2O_3$-based substrate 1 having a thickness of 1 mm In the subsequent grinding and polishing process, the β-$Ga_2O_3$-based substrate 1 is ground and polished until the thickness becomes about 600 μm.

Next, the β-$Ga_2O_3$-based substrate 1 is subjected to organic cleaning using methanol, acetone and methanol in this order for three minutes each, running water cleaning using ultrapure water, hydrofluoric acid immersion cleaning for fifteen minutes, sulfuric acid/hydrogen peroxide mixture immersion cleaning for five minutes and running water cleaning using ultrapure water, and is further subjected to thermal cleaning under conditions of at 800° C. for ten minutes. After this, the main surface 10 of the β-$Ga_2O_3$-based substrate 1 is ready for epitaxial growth of the β-$Ga_2O_3$-based crystal film 20.

The method of forming the β-Ga$_2$O$_3$-based crystal film 20 on the main surface 10 of the β-Ga$_2$O$_3$-based substrate 1 is PLD (Pulsed Laser Deposition), CVD (Chemical Vapor Deposition), sputtering and MBE (Molecular Beam Epitaxy) etc. In the present embodiment, a process using the MBE will be described as an example.

The MBE is a crystal growth method in which a single or compound solid is heated in an evaporation source called cell and vapor generated by heat is supplied as a molecular beam onto the surface of the substrate.

Figure 2:
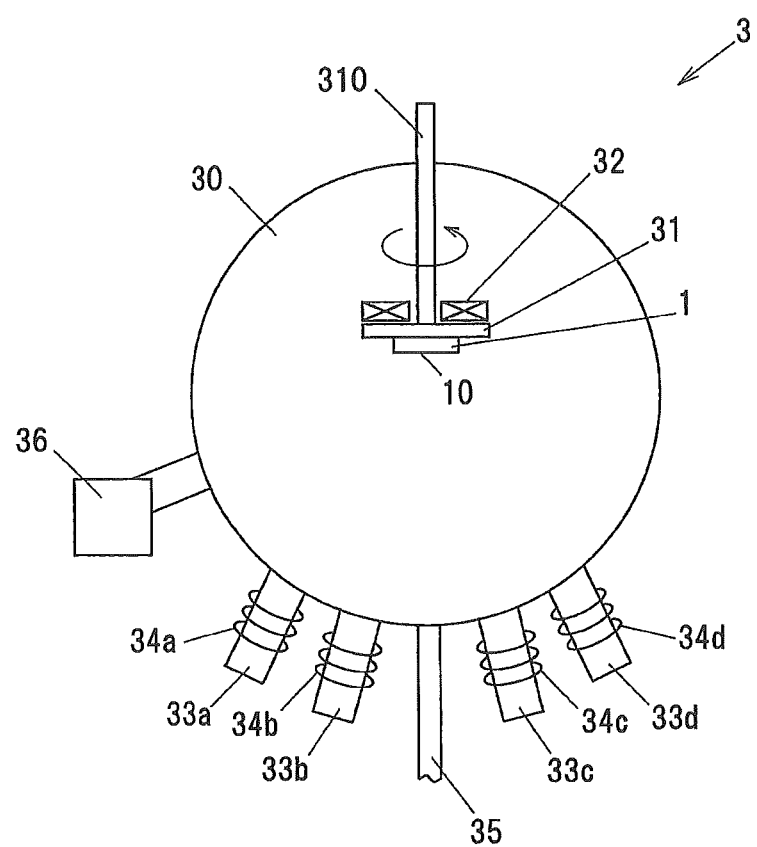
FIG. 2 is a cross sectional view showing an MBE system used for forming the crystal laminate structure.

FIG. 2 is a cross sectional view showing an MBE system used for forming the crystal laminate structure 2. The MBE system 3 is provided with a vacuum chamber 30, a substrate holder 31 supported in the vacuum chamber 30 to hold the β-Ga$_2$O$_3$-based substrate 1, heating devices 32 held on the substrate holder 31, plural cells 33 (33a, 33b, 33c, 33d) each containing one of raw materials of the β-Ga$_2$O$_3$-based crystal film 20, heaters 34 (34a, 34b, 34c, 34d) for respectively hearing the plural cells 33, a gas supply pipe 35 for supplying oxygen gas into the vacuum chamber 30, and a vacuum pump 36 for exhausting the air in the vacuum chamber 30. It is configured that the substrate holder 31 can be rotated by a non-illustrated motor via a shaft 310.

A Ga raw material and an Al raw material are respectively loaded in the first cell 33a and the second cell 33b. An n-type impurity raw material to be doped as a donor, such as Si or Sn, is loaded in the third cell 33c. A p-type impurity raw material to be doped as an acceptor, such as Mg or Zn, is loaded in the fourth cell 33d. Each of the first to fourth cells 33a to 33d is provided with a non-illustrated shutter and is configured such that the shutter can be closed when the raw material contained therein is not used.

Firstly, the β-Ga$_2$O$_3$-based substrate 1 is attached to the substrate holder 31 of the MBE system 3. Next, the vacuum pump 36 is activated to reduce atmospheric pressure in the vacuum chamber 30 to about $10^{-10}$ Torr. Then, the β-Ga$_2$O$_3$-based substrate 1 is heated by the heating devices 32. It should be noted that, radiation heat of heat source such as graphite heater of the heating device 32 is thermally transferred to the β-Ga$_2$O$_3$-based substrate 1 via the substrate holder 31 and the β-Ga$_2$O$_3$-based substrate 1 is thereby heated.

After the β-Ga$_2$O$_3$-based substrate 1 is heated to a predetermined temperature, oxygen-based gas is supplied into the vacuum chamber 30 through the gas supply pipe 35.

After a period of time required for stabilization of gas pressure in the vacuum chamber 30 (e.g., after 5 minutes) since the oxygen-based gas was supplied into the vacuum chamber 30, the cells 33a and 33b are heated by the heaters 34a and 34b while rotating the substrate holder 31 so that Ga vapor and Al vapor are started to be supplied. In case that a Ga$_2$O$_3$ crystal film not containing Al is formed as the β-Ga$_2$O$_3$-based crystal film 20, the first cell 33a is heated to start supply of Ga vapor.

Meanwhile, when imparting an n-type conductivity to the β-Ga$_2$O$_3$-based crystal film 20, vapor of the n-type impurity to be a donor such as Si or Sn is supplied from the third cell 33c by heating the third heater 34c. On the other hand, when imparting a p-type conductivity, vapor of the p-type impurity to be an acceptor such as Mg or Zn is supplied from the fourth cell 33d by heating the fourth heater 34d.

The vapor produced from each cell 33 is radiated as molecular beam onto the surface of the β-Ga$_2$O$_3$-based substrate 1. Beam-equivalent pressure (BEP) of Ga and that of Al are, e.g., respectively $1.5 \times 10^{-5}$ Pa and $5 \times 10^{-7}$ Pa. Meanwhile, in case of not producing Al vapor, for example, the Ga beam-equivalent pressure is e.g., $3 \times 10^{-5}$ Pa.

Then, a β-Ga$_2$O$_3$-based crystal is epitaxially grown on the main surface 10 of the β-Ga$_2$O$_3$-based substrate 1 and the β-Ga$_2$O$_3$-based crystal film 20 is thereby formed. Growth temperature and growth time of the β-Ga$_2$O$_3$-based crystal are, e.g., respectively 700° C. and 1 hour.

In addition, the β-Ga$_2$O$_3$-based crystal film 20 may be subjected to annealing treatment in an inert atmosphere, where necessary. The annealing treatment is performed in a heat treatment equipment such as lamp annealing apparatus. Alternatively, the annealing treatment may be performed in the MBE system 1.

[Second Embodiment]

A high-electron-mobility transistor (HEMT), which is one of semiconductor devices including the β-Ga$_2$O$_3$-based substrate 1 and the β-Ga$_2$O$_3$-based crystal film 20 of the first embodiment, will be described as the second embodiment.

Figure 3:
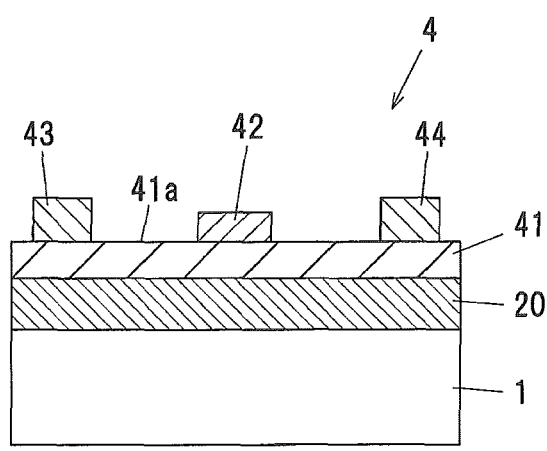
FIG. 3 is a cross sectional view showing a high-electron-mobility transistor in a second embodiment.

FIG. 3 is a cross sectional view showing a high-electron-mobility transistor in the second embodiment. This high-electron-mobility transistor 4 includes the β-Ga$_2$O$_3$-based substrate 1 and the β-Ga$_2$O$_3$-based crystal film 20 of the first embodiment. The high-electron-mobility transistor 4 further includes an n-type β-(AlGa)$_2$O$_3$ layer 41 on the β-Ga$_2$O$_3$-based crystal film 20, and a gate electrode 42, a source electrode 43 and a drain electrode 44 on the n-type β-(AlGa)$_2$O$_3$ layer 41. The gate electrode 42 is arranged between the source electrode 43 and the drain electrode 44.

The gate electrode 42 is in contact with a surface 41a of the n-type β-(AlGa)$_2$O$_3$ layer 41, thereby forming a Schottky junction. Meanwhile, the source electrode 43 and the drain electrode 44 are in contact with the surface 41a of the n-type β-(AlGa)$_2$O$_3$ layer 41, thereby faulting an ohmic junction.

In the second embodiment, the β-Ga$_2$O$_3$-based substrate 1 contains group II elements such as Mg and has high electrical resistance.

In the present embodiment, the β-Ga$_2$O$_3$-based crystal film 20 is of an i-type and functions as an electron transit layer. This i-typeβ-Ga$_2$O$_3$-based crystal film 20 is formed by epitaxially growing a β-Ga$_2$O$_3$-based single crystal on the main surface 10 of the β-Ga$_2$O$_3$-based substrate 1.

The n-type β-(AlGa)$_2$O$_3$ layer 41 is an electron supply layer doped with a donor such as Si or Sn and is formed by epitaxial growth on the β-Ga$_2$O$_3$-based crystal film 20.

Since the β-Ga$_2$O$_3$-based crystal film 20 and the n-type β-(AlGa)$_2$O$_3$ layer 41 have different band gaps, discontinuity of bands occurs at the interface therebetween, electrons generated from the donor in the n-type β-(AlGa)$_2$O$_3$ layer 41 are concentrated on the β-Ga$_2$O$_3$-based crystal film 20 side and are distributed in a region in the vicinity of the interface, and an electron layer called two-dimensional electron gas is thereby formed.

As such, a first depletion layer due to the Schottky junction with the gate electrode 42 and a second depletion layer due to the formation of two-dimensional electron gas are produced in the n-type β-(AlGa)$_2$O$_3$ layer 41. The n-type β-(AlGa)$_2$O$_3$ layer 41 has a thickness at which the first depletion layer is in contact with the second depletion layer.

Voltage is applied to the gate electrode 42 to change the thicknesses of the first and second depletion layers and to adjust the concentration of the two-dimensional electron gas, thereby allowing drain current to be controlled.

The thickness of the β-Ga$_2$O$_3$-based crystal film 20 is not specifically limited but is desirably not less than 0.1 nm. In addition, the thickness of the n-type β-(AlGa)$_2$O$_3$ layer 41 is set to 0.1 to 10 μm depending on a doping concentration.

[Third Embodiment]

A MESFET (Metal-Semiconductor Field Effect Transistor), which is one of semiconductor devices including the β-Ga$_2$O$_3$-based substrate 1 and the β-Ga$_2$O$_3$-based crystal film 20 of the first embodiment, will be described as the third embodiment.

Figure 4:
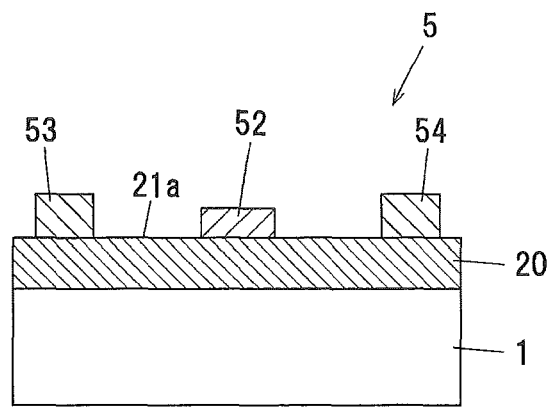
FIG. 4 is a cross sectional view showing a MESFET in a third embodiment.

FIG. 4 is a cross sectional view showing a MESFET in the third embodiment. This MESFET 5 includes the β-Ga$_2$O$_3$-based substrate 1 and the β-Ga$_2$O$_3$-based crystal film 20 of the first embodiment. The MESFET 5 further includes a gate electrode 52, a source electrode 53 and a drain electrode 54 on the β-Ga$_2$O$_3$-based crystal film 20. The gate electrode 52 is arranged between the source electrode 53 and the drain electrode 54.

The gate electrode 42 is in contact with a surface 21a of the β-Ga$_2$O$_3$-based crystal film 20, thereby forming a Schottky junction. Meanwhile, the source electrode 53 and the drain electrode 54 are in contact with the surface 21a of the β-Ga$_2$O$_3$-based crystal film 20, thereby forming an ohmic junction.

In the third embodiment, the β-Ga$_2$O$_3$-based substrate 1 contains group II elements such as Mg and has high electrical resistance.

In the present embodiment, the β-Ga$_2$O$_3$-based crystal film 20 is of an n-type and the donor concentration thereof in the vicinity of contact areas with the source electrode 53 and with the drain electrode 54 is higher than that in the remaining portion.

The thickness of the depletion layer in the β-Ga$_2$O$_3$-based crystal film 20 under the gate electrode 52 is changed by controlling bias voltage applied to the gate electrode 52, thereby allowing drain current to be controlled.

[Fourth Embodiment]

A Schottky-barrier diode, which is one of semiconductor devices including the β-Ga$_2$O$_3$-based substrate 1 and the β-Ga$_2$O$_3$-based crystal film 20 of the first embodiment, will be described as the fourth embodiment.

Figure 5:
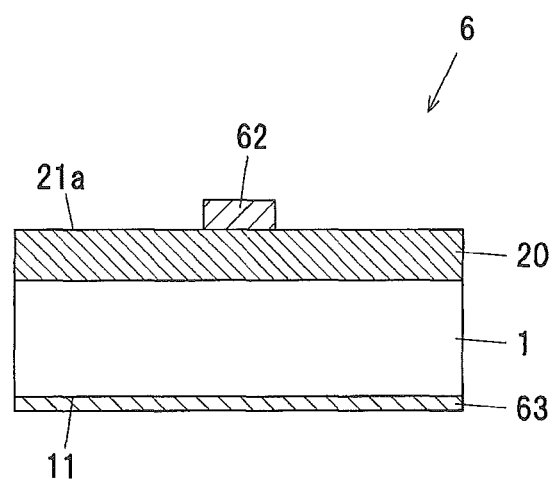
FIG. 5 is a cross sectional view showing a Schottky-barrier diode in a fourth embodiment.

FIG. 5 is a cross sectional view showing a Schottky-barrier diode in the fourth embodiment. This Schottky-barrier diode 6 includes the β-Ga$_2$O$_3$-based substrate 1 and the β-Ga$_2$O$_3$-based crystal film 20 of the first embodiment. The Schottky-barrier diode 6 further includes a Schottky electrode 62 on the β-Ga$_2$O$_3$-based crystal film 20 and an ohmic electrode 63 on a surface 11 of the β-Ga$_2$O$_3$-based substrate 1 opposite to the β-Ga$_2$O$_3$-based crystal film 20.

The Schottky electrode 62 is in contact with the surface 21a of the β-Ga$_2$O$_3$-based crystal film 20, thereby forming a Schottky junction. Meanwhile, the ohmic electrode 63 is in contact with the surface 11 of the β-Ga$_2$O$_3$-based substrate 1, thereby forming an ohmic junction.

In the fourth embodiment, the β-Ga$_2$O$_3$-based substrate 1 and the β-Ga$_2$O$_3$-based crystal film 20 are of an n-type and the donor concentration of the β-Ga$_2$O$_3$-based crystal film 20 is lower than that of the β-Ga$_2$O$_3$-based substrate 1.

When forward voltage (electric potential is positive on the Schottky electrode 62 side) is applied to the Schottky diode 6, the number of electrons moving from the β-Ga$_2$O$_3$-based substrate 1 to the β-Ga$_2$O$_3$-based crystal film 20 is increased. As a result, a forward current flows from the Schottky electrode 62 to the ohmic electrode 63.

On the other hand, when reverse voltage (electric potential is negative on the Schottky electrode layer 62 side) is applied to the Schottky diode 6, substantially no electric current flows through the Schottky diode 6.

(Effects of the Embodiments)

According to the embodiments described above, since a β-Ga$_2$O$_3$-based substrate of which main face is a plane rotated by not less than 50° and not more than 90° with respect the (100) plane is used as a base for epitaxial crystal growth, it is possible to grow a β-Ga$_2$O$_3$-based crystal at a sufficient rate and thereby to form a high-quality β-Ga$_2$O$_3$-based crystal film. In addition, use of such high-quality β-Ga$_2$O$_3$-based crystal films allows high-performance semiconductor devices excellent in operating characteristics to be formed.

In addition, since waste of the raw materials of the β-Ga$_2$O$_3$-based crystal can be reduced, it is possible to reduce the manufacturing cost of semiconductor devices which include a β-Ga$_2$O$_3$-based crystal film and a β-Ga$_2$O$_3$-based crystal film.

EXAMPLES

In the present example, the growth rate of the β-Ga$_2$O$_3$-based crystal was evaluated using plural β-Ga$_2$O$_3$-based substrates of which main surfaces respectively have different plane orientations.

Firstly, a β-Ga$_2$O$_3$ ingot made by the FZ method was sliced using a wire saw, thereby forming β-Ga$_2$O$_3$ single crystal substrates of 1 mm in thickness. Here, five types of β-Ga$_2$O$_3$ single crystal substrates respectively having the (−201) plane, the (101) plane, the (001) plane, the (310) plane and the (010) plane as the main surface were formed as the β-Ga$_2$O$_3$-based substrate 1 while a β-Ga$_2$O$_3$ single crystal substrate having the (100) plane as the main surface was formed as Comparative Example.

Next, in the grinding and polishing process, each β-Ga$_2$O$_3$ single crystal substrate was ground and polished until the thickness became about 600 μm.

Next, each β-Ga$_2$O$_3$ single crystal substrate was subjected to organic cleaning using methanol, acetone and methanol in this order for three minutes each, running water cleaning using ultrapure water, hydrofluoric acid immersion cleaning for fifteen minutes, sulfuric acid/hydrogen peroxide mixture immersion cleaning for five minutes and running water cleaning using ultrapure water, and was further subjected to thermal cleaning under conditions of at 800° C. for ten minutes.

Next, a β-Ga$_2$O$_3$ crystal was grown on each β-Ga$_2$O$_3$ single crystal substrate in an oxygen-based gas atmosphere by the MBE and a β-Ga$_2$O$_3$ crystal film was thereby formed as the β-Ga$_2$O$_3$-based crystal film 20. The Ga beam-equivalent pressure was 3×10$^5$ Pa.

The growth temperature and growth time of the β-Ga$_2$O$_3$ crystal were respectively 700° C. and 1 hour. In addition, on the β-Ga$_2$O$_3$ single crystal substrates having the (100) plane and the (010) plane as the main surface, crystal growth of β-Ga$_2$O$_3$ was also performed under the condition of a growth temperature of 500° C.

Figure 6:
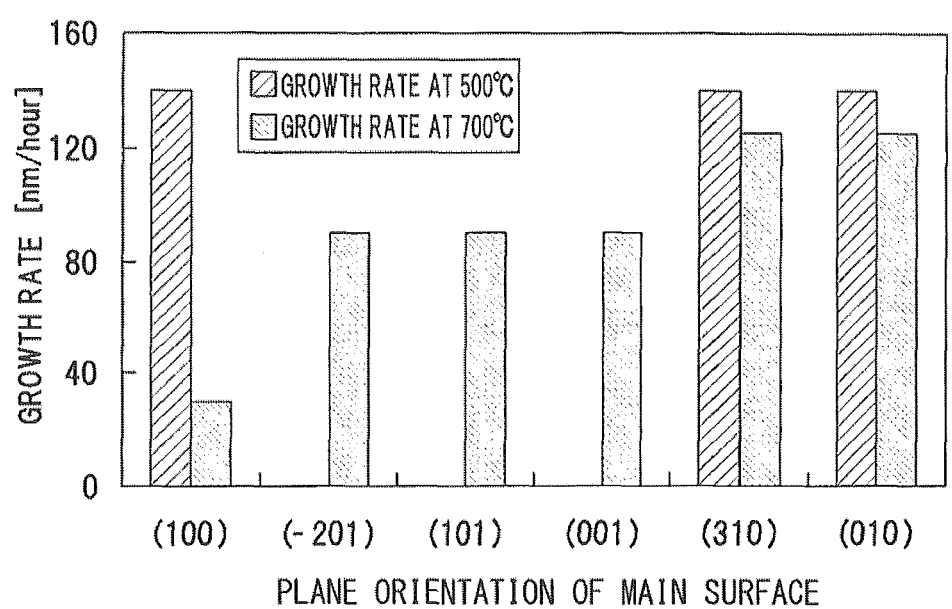
FIG. 6 is a graph showing the growth rate of β-$Ga_2O_3$ crystal on β-$Ga_2O_3$ single crystal substrates.

FIG. 6 is a graph showing growth rates of the respective β-Ga$_2$O$_3$ crystals on the β-Ga$_2$O$_3$ single crystal substrates.

As shown in FIG. 6, in case of crystal growth at 700° C. which is a temperature allowing a β-Ga$_2$O$_3$ crystal with sufficient quality to be grown, the growth rate was about 30 nm/hour on the β-Ga$_2$O$_3$ single crystal substrate having the (100) plane as the main surface. On the other hand, the growth rate was about 90 to 130 nm/hour on the β-Ga$_2$O$_3$ single crystal substrates having the (−201) plane, the (101) plane, the (001) plane, the (310) plane and the (010) plane as the main surface.

This result shows that, on the β-Ga$_2$O$_3$-based substrates having the (−201) plane, the (101) plane, the (001) plane, the (310) plane and the (010) plane as the main surface which were formed as the β-Ga$_2$O$_3$-based substrates 1 of the embodiments, the growth rate of the β-Ga$_2$O$_3$ crystal is remarkably faster than that on the β-Ga$_2$O$_3$ single crystal substrate having the (100) plane as the main surface. It should be noted that, it is generally rare that the growth rate of crystal is improved so much only by changing the plane orientation of the main surface of the substrate and it can be said that this result is beyond expectation of those skilled in the art.

It was also confirmed that, when the β-Ga$_2$O$_3$ crystal is grown on the β-Ga$_2$O$_3$ single crystal substrate having the (100) plane as the main surface at a growth temperature of 700° C., the growth rate is about one-fifth of that of the β-Ga$_2$O$_3$ crystal grown at a growth temperature of 500° C. It is believed that this is because the raw materials of the β-Ga$_2$O$_3$ crystal re-evaporate from the substrate.

On the other hand, it was confirmed that, when the β-Ga$_2$O$_3$ crystal is grown on the β-Ga$_2$O$_3$ single crystal substrates having the (310) plane and the (010) plane as the main surface at a growth temperature of 700° C., the growth rate is substantially the same as that of the β-Ga$_2$O$_3$ crystal grown at a growth temperature of 500° C. It is believed that re-evaporation of the raw materials of the β-Ga$_2$O$_3$ crystal from the substrate is suppressed when the β-Ga$_2$O$_3$ single crystal substrate having the (010) plane as the main surface is used. It is considered that the same applies to the case where the β-Ga$_2$O$_3$ single crystal substrates having the (−201) plane, the (101) plane and the (001) plane as the main surface are used.

Figure 7:
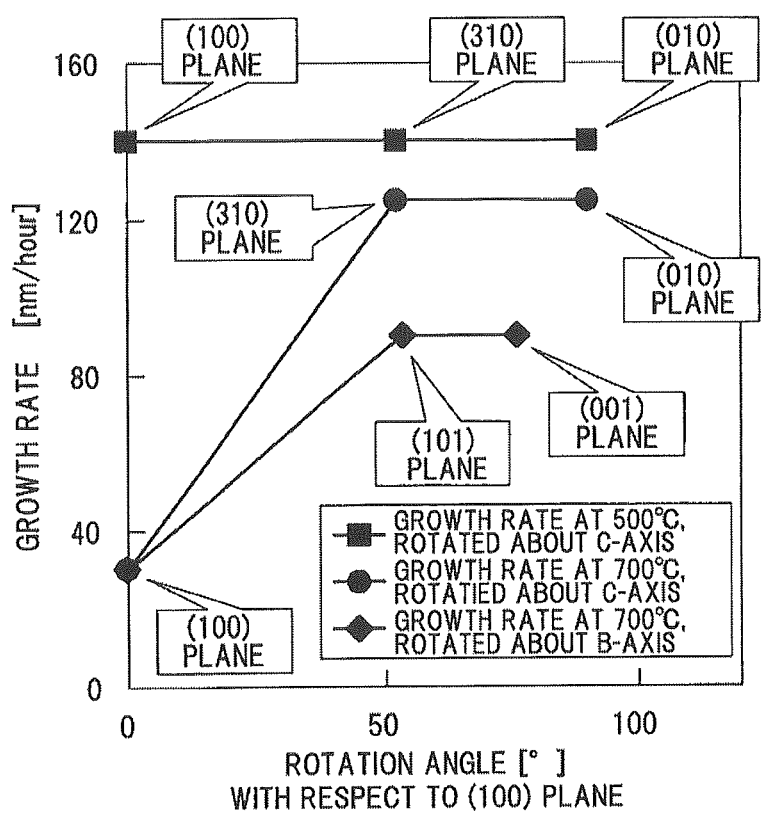
FIG. 7 is a graph showing a relation between the growth rate of β-$Ga_2O_3$ crystal and a rotation angle with respect to a (100) plane as a main surface of the β-$Ga_2O_3$ single crystal substrate.

FIG. 7 is a graph showing a relation between the growth rate of the β-Ga$_2$O$_3$ crystal and a rotation angle with respect to the (100) plane as the main surface of the β-Ga$_2$O$_3$ single crystal substrate. In FIG. 7, the filled square indicates a value of the growth rate at a growth temperature of 500° C. when the main surface is rotated around the c-axis. The filled circle indicates a value of the growth rate at a growth temperature of 700° C. when the main surface is rotated around the c-axis. The filled diamond indicates a value of the growth rate at a growth temperature of 700° C. when the main surface is rotated around the b-axis.

It is understood from FIG. 7 that, when the rotation angle with respect to (100) plane as the main surface of the β-Ga$_2$O$_3$ single crystal substrate is not less than 50°, the growth rate when growing the β-Ga$_2$O$_3$ crystal at a growth temperature of 700° C. is significantly improved as compared to the case where the main surface is the (100) plane. It is also understood that, when the β-Ga$_2$O$_3$ crystal is grown at a growth temperature of 500° C., the growth rate of the β-Ga$_2$O$_3$ crystal hardly depends on the rotation angle with respect to (100) plane as the main surface of the β-Ga$_2$O$_3$ single crystal substrate.

Although the embodiments and example of the invention have been described above, the invention according to claims is not to be limited to the above-mentioned embodiments and example. Further, it should be noted that all combinations of the features described in the embodiments and example are not necessary to solve the problem of the invention.

INDUSTRIAL APPLICABILITY

A crystal laminate structure in which crystals can be epitaxially grown on a β-Ga$_2$O$_3$-based substrate with high efficiency to produce a high-quality β-Ga$_2$O$_3$-based crystal film, and a method for producing the same are provided.

REFERENCE SIGNS LIST

1: β-Ga$_2$O$_3$-based substrate
2: crystal laminate structure
4: high-electron-mobility transistor
5: MESFET
6: Schottky-barrier diode
10: main surface
20: β-Ga$_2$O$_3$-based crystal film

The invention claimed is:

1. A crystal laminate structure, comprising:
 a β-Ga$_2$O$_3$-based substrate comprising as a main surface a plane rotated by not less than 50° and not more than 90° with respect to a (100) plane; and
 a β-Ga$_2$O$_3$-based crystal film provided on the main surface of the β-Ga$_2$O$_3$-based substrate,
 wherein the β-Ga$_2$O$_3$-based crystal film is in a Schottky-contact with an electrode, and
 wherein the β-Ga$_2$O$_3$-based substrate contains group II elements.

2. The crystal laminate structure according to claim 1, wherein the main surface of the β-Ga$_2$O$_3$-based substrate comprises one of a (010) plane, a (001) plane, a (−201) plane, a (101) plane, and a (310) plane.

3. The crystal laminate structure according to claim 1, wherein the β-Ga$_2$O$_3$-based substrate comprises Mg as the group II elements.

4. The crystal laminate structure according to claim 1, wherein the β-Ga$_2$O$_3$- based crystal film comprises:
 an i-type β-Ga$_2$O$_3$-based crystal film provided on the main surface of the β-Ga$_2$O$_3$-based substrate; and
 an n-type β-(AlGa)$_2$O$_3$ crystal film provided on the i-type β-Ga$_2$O$_3$-based crystal film, and that is in the Schottky-contact with the electrode.

5. The crystal laminate structure according to claim 4, wherein the main surface of the β-Ga$_2$O$_3$-based substrate comprises one of a (010) plane, a (001) plane, a (−201) plane, a (101) plane, and a (310) plane.

6. The crystal laminate structure according to claim 4, wherein the β-Ga$_2$O$_3$-based substrate comprises Mg as the group II elements.

7. The crystal laminate structure according to claim 1, wherein the β-Ga$_2$O$_3$-based crystal film comprises an n-type β-Ga$_2$O$_3$-based crystal film.

8. The crystal laminate structure according to claim 7, wherein the main surface of the β-Ga$_2$O$_3$-based substrate comprises one of a (010) plane, a (001) plane, a (−201) plane, a (101) plane, and a (310) plane.

9. The crystal laminate structure according to claim 7, wherein the β-Ga$_2$O$_3$-based substrate comprises Mg as the group II elements.

10. The crystal laminate structure according to claim 1, wherein the β-Ga$_2$O$_3$-based crystal film is in an ohmic-contact with another electrode.

11. The crystal laminate structure according to claim 1, wherein the electrode comprises a gate electrode that is in the Schottky-contact with the β-Ga$_2$O$_3$-based crystal film.

12. The crystal laminate structure according to claim 11, further comprising a source electrode and a drain electrode each being disposed on a same surface of the crystal laminate structure that the gate electrode is disposed, each of the source electrode and the drain electrode being in an ohmic-contact with the β-Ga$_2$O$_3$-based crystal film.

* * * * *